United States Patent
Aikawa et al.

(10) Patent No.: US 6,909,333 B2
(45) Date of Patent: Jun. 21, 2005

(54) COPLANAR LINE BASED HIGH FREQUENCY OSCILLATOR

(75) Inventors: Masayoshi Aikawa, 26-11, Nara 2-chome, Aoba-ku, Yokohama-shi, Kanagawa (JP); Takayuki Tanaka, Saga (JP); Fumio Asamura, Saitama (JP); Takeo Oita, Saitama (JP)

(73) Assignees: Masayoshi Aikawa, Kanagawa (JP); Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/329,861

(22) Filed: Dec. 26, 2002

(65) Prior Publication Data

US 2003/0122628 A1 Jul. 3, 2003

(30) Foreign Application Priority Data

Dec. 28, 2001 (JP) ........................................ 2001-402066

(51) Int. Cl.[7] .............................................. H03B 5/18
(52) U.S. Cl. ..................... 331/56; 331/107 SL; 333/204
(58) Field of Search .................... 331/56, 115, 107 SL, 331/107 G, 107 DP; 333/204, 219

(56) References Cited

U.S. PATENT DOCUMENTS 4,642,584 A * 2/1987 Funck et al. ................ 333/17.2
5,021,748 A * 6/1991 Chang et al. ................ 330/286
5,142,255 A * 8/1992 Chang et al. ................ 333/204
5,659,274 A * 8/1997 Takahashi et al. .......... 333/204
2003/0062963 A1 * 4/2003 Aikawa et al. .......... 331/177 V

* cited by examiner

Primary Examiner—Robert Pascal
Assistant Examiner—Joseph Chang
(74) Attorney, Agent, or Firm—Katten Muchin Zavis Rosenman

(57) ABSTRACT

A high frequency oscillator has a substrate made of, for example, a dielectric material, a resonator circuit disposed on one principal surface of the substrate and formed of a finite-length coplanar line having a signal line and a ground conductor arranged along the signal line on both sides thereof, a negative resistance element for connecting between the signal line and the ground conductor, and an output line routed on the other principal surface of the substrate and electromagnetically coupled to the resonator circuit through the substrate. A Gunn diode is preferably used for the negative resistance element, and is connected, for example, in a substantially central region of the signal line. The output line preferably forms a microstrip line structure together with the ground conductor.

22 Claims, 18 Drawing Sheets

COPLANAR LINE BASED HIGH FREQUENCY OSCILLATOR

BACKGROUND OF THE INVENTION

1. Field of the Invention

The present invention relates to a high frequency oscillator for microwave and millimeter bands, and more particularly, to a high frequency oscillator which employs a coplanar line based planar resonator circuit.

2. Description of the Related Arts

A high frequency oscillator for a microwave band or a millimeter band is a highly significant component in terms of performance as well as cost even among main components used in a high frequency apparatus or a high speed apparatus. A high frequency oscillator of the type mentioned above employs a planar resonator circuit of a microstrip line type. FIG. 1A is a plan view illustrating an example of such a conventional high frequency oscillator, and FIG. 1B is a cross-sectional view taken along a line A—A in FIG. 1A.

The high frequency oscillator illustrated in FIGS. 1A and 1B comprises microstrip line resonator circuit 1, and a negative resistance element (i.e., oscillation element), for example, Gunn diode 2 which is a two-port element. Resonator circuit 1 comprises substrate 3 made of a dielectric material or the like; circular circuit conductor 1A formed on one principal surface of substrate 3; and ground conductor 4 formed substantially over the entirety of the other principal surface of substrate 3. On the one principal surface of substrate 3, matching line 5 is extended from one end (left end in FIG. 1A) on the periphery of circuit conductor 1A, and one end of Gunn diode 2 is connected to matching line 5. The other end of Gunn diode 2 is connected to ground conductor 4 through a via hole (not shown) formed in substrate 3. Output line 6 in a microstrip line structure is also connected to another end (right end in FIG. 1A) on the periphery of circuit conductor 1A, and another capacitive matching line 5 is connected to output line 6.

In the illustrated high frequency oscillator, Gunn diode 2 presents a negative resistance in a resonant frequency region of microstrip line resonator circuit 1. Resonator circuit 1 is powered by Gunn diode 2 to maintain a resonant state, resulting in oscillation. The oscillation frequency generally depends on the resonant frequency of resonator circuit 1 which is determined by the size of circuit conductor 1A and the dielectric coefficient of substrate 3. It should be noted that discrete elements such as Gunn diode 2 are much expected as oscillation elements, particularly in a millimeter band and the like, because they are relatively inexpensive.

However, in the high frequency oscillator configured as described above, the negative resistance element such as a Gunn diode has relatively low impedance, while the microstrip line resonator circuit has high impedance, so that it is generally difficult to match the impedance between the two components. In addition, the substrate must be provided with a via hole for grounding the Gunn diode in high frequency terms, causing deteriorated characteristics resulting from a parasitic reactance of the via hole, for example, a reduction in oscillation output (or oscillation power) associated with a circuit loss, particularly when the oscillation frequency is high. Moreover, the requirement for a process for forming the via hole impedes an improved productivity.

A high frequency oscillator proposed for solving problems such as a reduction in oscillation power utilizes a higher order resonance mode (for example, $TM_{21}$) of microstrip line resonator circuit 1, and Gunn diodes 2 connected through matching lines 5 to a plurality of equipotential points located at geometrically symmetric points on resonator circuit 1, as illustrated in FIG. 2, to combine oscillation outputs. However, even this high frequency oscillator needs a via hole and accordingly cannot avoid the influence of the reactance which is parasite on the via hole, resulting in a lower combination efficiency of the oscillation power.

SUMMARY OF THE INVENTION

It is an object of the present invention to provide a highly productive high frequency oscillator which facilitates a variety of circuit designs including the impedance matching and readily provides an increased oscillation output.

The inventors found that the problem in the conventional high frequency oscillator was caused by the microstrip line resonator circuit which had the circuit conductor (i.e., signal line) formed on one principal surface of the substrate and the ground conductor on the other principal surface. Then, the inventors perceived a planar resonator circuit having a coplanar line (i.e., coplanar waveguide) structure which has a signal line and ground conductors disposed on both sides of the signal line on the same principal surface of the substrate, and eventually reached the completion of the present invention.

Specifically, the object of the present invention is solved by a high frequency oscillator comprising a substrate, a resonator circuit disposed on one principal surface of the substrate, and formed of a finite-length coplanar line having a signal line and a ground conductor arranged along the signal line on both sides thereof, a negative resistance element for connecting between the signal line and the ground conductor, and an output line routed on the other principal surface of the substrate and electromagnetically coupled to the resonator circuit through the substrate.

In the present invention, the output line is typically routed on the other principal surface of the substrate such that its leading end portion overlaps the signal line of the coplanar line resonator circuit, and forms a microstrip line structure together with the ground conductor disposed on the one principal surface of the substrate. A Gunn diode, for example, is preferably used for the negative resistance element.

In the present invention, since the coplanar line resonator circuit is applied for connection of the negative resistance element, the negative resistance element can be grounded in high frequency terms on the one principal surface of the substrate. This eliminates the need for a via hole otherwise required when a microstrip line resonator circuit is used, so that the negative resistance element is readily mounted with a reduced circuit loss and parasitic reactance component, resulting in high oscillation performance in the microwave band and millimeter band. Also, since the coplanar line resonator circuit has different impedance at different points on the signal line of the coplanar line due to a standing wave generated along the coplanar line, the impedance matching can be readily achieved between the negative resistance element and resonator circuit only by appropriately determining where the negative resistance element should be connected, without providing a matching line or a matching circuit. This results in readiness in the designing of various circuits including the impedance matching, readiness in increasing the output of the oscillator, and a higher productivity of the oscillator.

As described above, the present invention can facilitate the configuration of the high frequency oscillator, increase the output, oscillate at higher frequencies, and improve the quality of the oscillation through the utilization of the transmission characteristic and line structure of the coplanar line and microstrip line routed on both sides of the substrate by so-called double planar circuit techniques. Specifically, the high frequency oscillator configured according to the present invention can provide the following advantageous effects:

(1) The use of a coplanar line permits an oscillation diode or a negative resistance IC (integrated circuit) chip, which serves as the negative resistance element, to be accurately and efficiently mounted on the substrate by bump mounting or surface mounting. As a result, an ultra-high frequency oscillator can be readily practiced in a millimeter band and a sub-millimeter band.

(2) The high frequency oscillator of the present invention can readily carry out the oscillation using a plurality of oscillation elements or negative resistance elements by virtue of its circuit configuration, and is also suitable for increasing the output through power combination and reducing phase noise.

(3) The high frequency oscillator of the present invention can readily conduct a variable control of the oscillation frequency as well as can readily carry out push-push oscillation for outputting a second harmonic or a fourth harmonic of the fundamental oscillation frequency.

DETAILED DESCRIPTION OF THE INVENTION

Figure 1A:
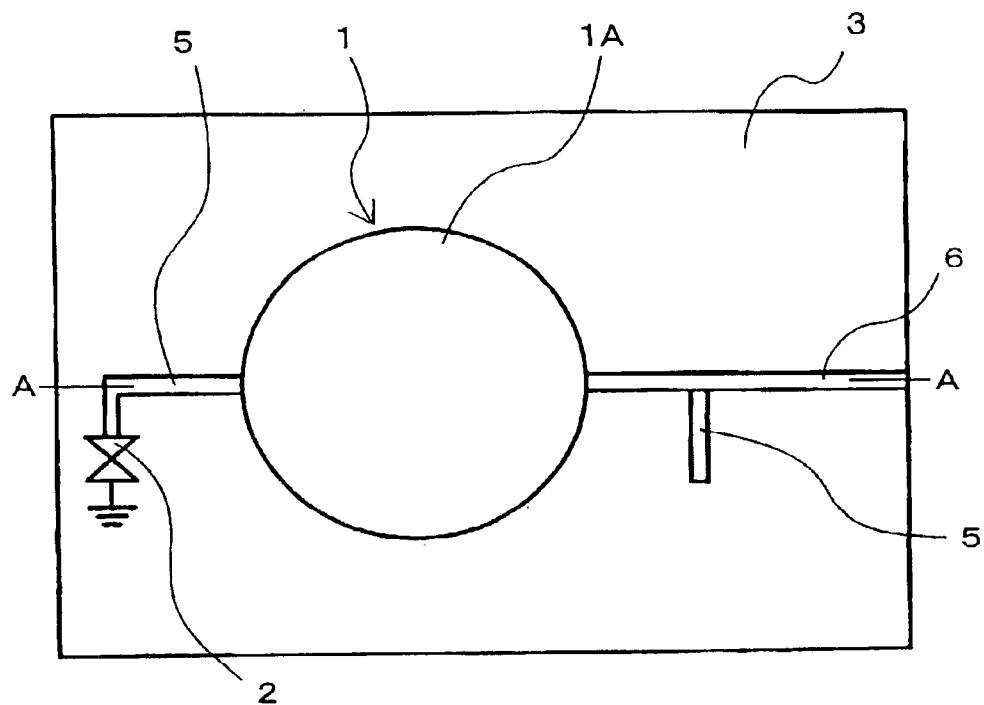
FIG. 1A is a plan view illustrating an example of conventional high frequency oscillator.
Figure 1B:
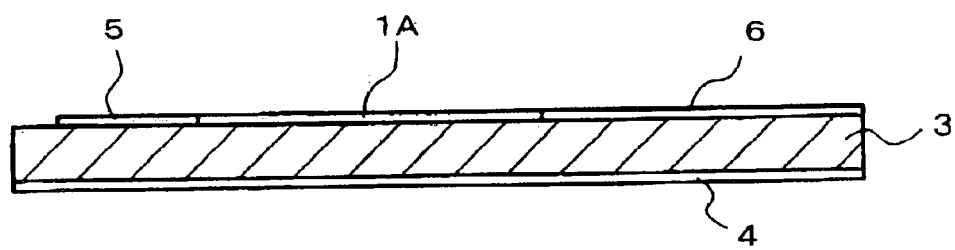
FIG. 1B is a cross-sectional view taken along a line A—A in FIG. 1A.
Figure 2:
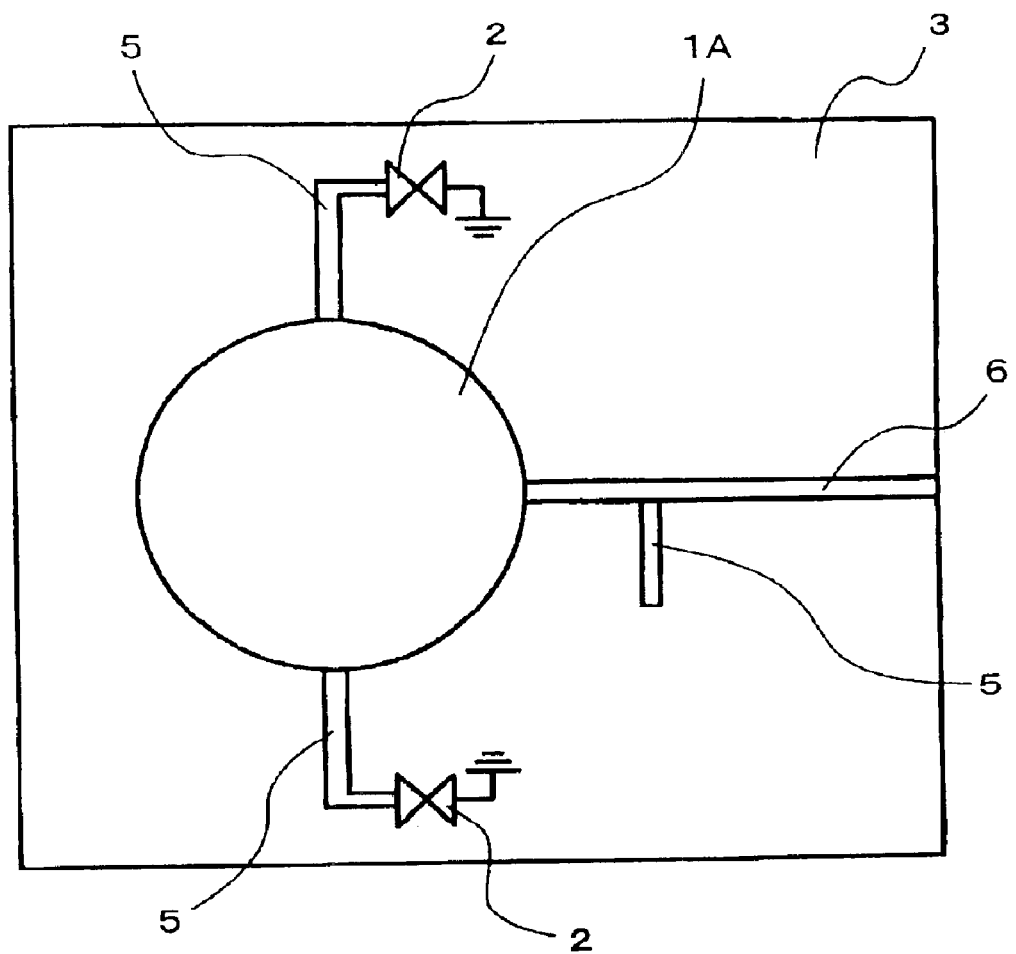
FIG. 2 is a plan view illustrating another example of conventional high frequency oscillator.
Figure 3A:
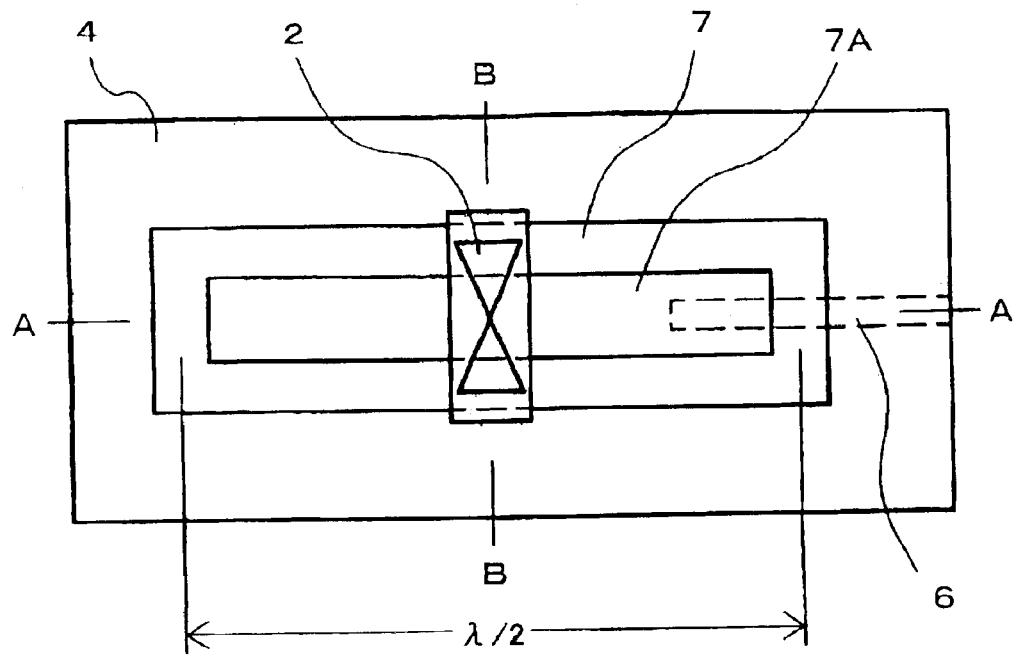
FIG. 3A is a plan view illustrating a high frequency oscillator according to a first embodiment of the present invention.
Figure 3B:
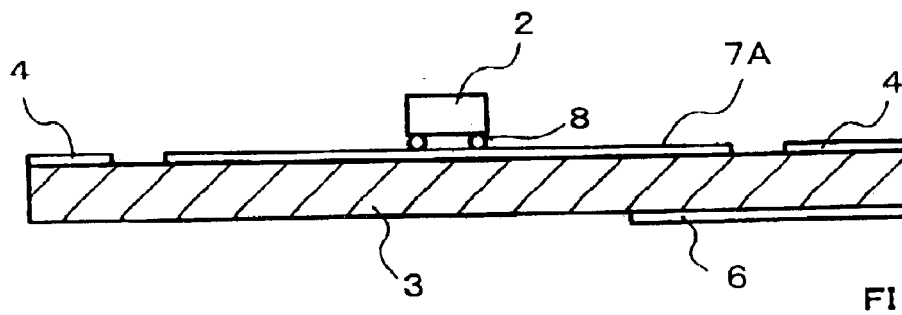
FIG. 3B is a cross-sectional view taken along a line A—A in FIG. 3A.
Figure 3C:
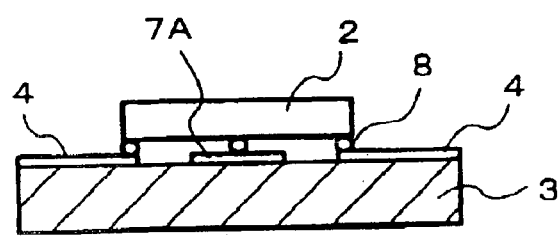
FIG. 3C is a cross-sectional view taken along a line B—B in FIG. 3A.

A high frequency oscillator according to a first embodiment of the present invention illustrated in FIGS. 3A to 3C comprises ground conductor 4 formed substantially over the entirety of one principal surface of substrate 3 made of, for example, a dielectric material. Ground conductor 4 is formed with an elongated opening and linear signal line 7A routed within the opening. Signal line 7A extends in the direction in which the opening extends, with both ends being opened. Ground conductor 4, the opening and signal line 7A make up coplanar line resonator circuit 7. Signal line 7A has au electric length of approximately λ/2, where λ represents a wavelength corresponding to the oscillation frequency. Signal line 7A is surrounded by ground conductor 4 through an exposed region of substrate 3 on both lateral and vertical sides. While the electric length of the coplanar line is herein set at λ/2, it may he an integer multiple of λ/2. When the electric length of the coplanar line is set at λ/2, coplanar line resonator circuit 7 is comprised of a coplanar transmission line which is opened at both ends for the oscillation frequency. Gunn diode 2 is disposed on resonator circuit 7 as mentioned to serve as a negative resistance element.

Gunn diode 2 has, for example, two anodes sandwiching a common cathode, and a total of three ports which include one port positioned in a central portion of the outer surface thereof for connection with the common cathode, and a pair of ports positioned at both ends of the outer surface for connection with the anodes. Then, in a central region of coplanar line resonator circuit 7, the central port of Gunn diode 2 is connected to signal line 7A, and both end ports to ground conductor 4 on both sides of resonator circuit 7, respectively, by flip-chip mounting using bumps 8. Each port connects to two bumps 8 and total six bumps are formed in the drawing. In the illustrated high frequency oscillator, Gunn diode 2 is mounted at the midpoint of signal line 7A. Signal line 7A is applied with a DC bias-voltage for Gunn diode 2, for example, through a supply line, not shown.

Substrate 3 is formed with a microstrip line on the other principal surface as output line 6 which is electromagnetically coupled to one end side of coplanar line resonator circuit 7. Here, linear output line 6 is arranged such that the leading and thereof overlaps the one end side of signal line 7A through substrate 3, and output line 6 extends in the direction in which the coplanar line extends.

In this high frequency oscillator, a high frequency component propagates through the coplanar line by the action of an electric field produced between signal line 7A and ground conductor 4 positioned on both sides of signal line 7A, and a magnetic field produced by the electric field. Due to both ends of the coplanar line being opened, the coplanar line is set in a resonance mode by a standing wave with a voltage distribution which presents a minimum at the center and a maximum at both ends. A current distribution presents a maximum at the center and a minimum at both ends. Since Gunn diode 2 is connected to coplanar line resonator circuit 7 to function as an oscillation element, coplanar line resonator circuit 7 is supplied with power in the resonant frequency region to oscillate. Consequently, an oscillation output is delivered from output line 6 in a microstrip line structure electromagnetically coupled to resonator circuit 7.

In this event, since low impedance Gunn diode 2 is connected in a central region of coplanar line resonator circuit 7 in which the current substantially reaches the maximum in the resonance mode and the voltage reaches the minimum, impedance matching can be readily achieved between Gunn diode 2 and resonator circuit 7 without additionally providing an extra matching circuit or matching line. In addition, since signal line 7A and ground conductor 4 of coplanar line resonator circuit 7 are disposed on the same principal surface of substrate 3, Gunn diode 2 can be readily mounted on this principal surface. Moreover, elimination of the need for a via hole formed through substrate 3 contributes to a reduced circuit loss and an increased oscillation output.

Since output line 6 in a microstrip line structure is routed on the other principal surface of substrate 3 such that output line 6 is electromagnetically coupled to resonator circuit 7, Gunn diode 2 may be disposed at any position at which it matches the resonance mode of the coplanar line. In addition, Gunn diode 2 may be applied with the DC bias voltage (power supply voltage), for example, at a null voltage point in the resonance mode, which is located on the center line of the coplanar line in the width direction, thereby successfully avoiding the influence on the high frequency oscillation. As described above, the DC bias voltage is applied at this supply position to which the supply line, not shown is connected.

Figure 4A:
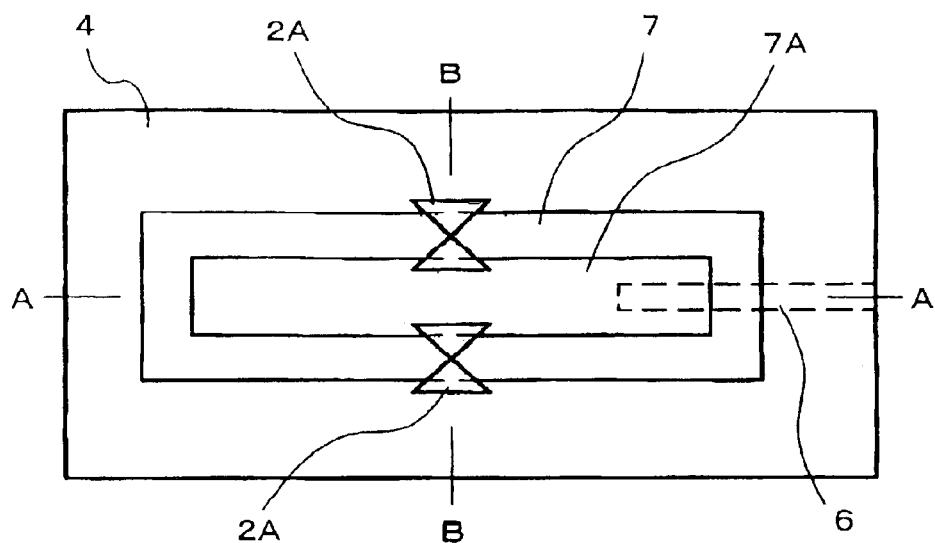
FIG. 4A is a plan view illustrating another example of the high frequency oscillator according to the first embodiment.
Figure 4B:
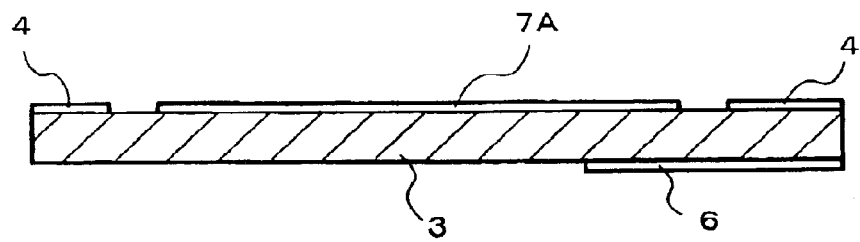
FIG. 4B is a cross-sectional view taken along a line A—A in FIG. 4A.
Figure 4C:
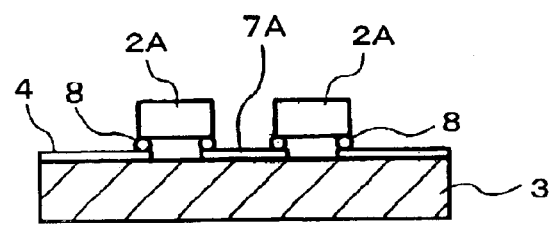
FIG. 4C is a cross-sectional view taken along a line B—B in FIG. 4A.

While the high frequency oscillator illustrated in FIGS. 3A to 3C employs three-port Gunn diode 2 having a pair of anodes across the common cathode, the three-port Gunn diode may be replaced with two-port Gunn diodes each simply having an anode and a cathode. FIGS. 4A to 4C illustrate a high frequency oscillator which employs two-port Gunn diodes 2A instead of three-port Gunn diode 2 in the high frequency oscillator illustrated in FIGS. 3A to 3C. In this event, the high frequency oscillator employs two Gunn diodes 2A, one of which is arranged between signal line 7A and upper ground conductor 4, and the other of which is arranged between signal line 7A and lower ground conductor, as illustrated, in a central region of coplanar line resonator circuit 7. Each port of Gunn diode 2A connects to two bumps 8 and total four bumps are formed in the drawings. It should be noted that the Gunn diode can be readily mounted in the high frequency oscillator illustrated in FIGS. 3A to 3C as compared with that illustrated in FIGS. 4A to 4C because the former can reduce the number of required Gunn diodes.

Figure 5A:
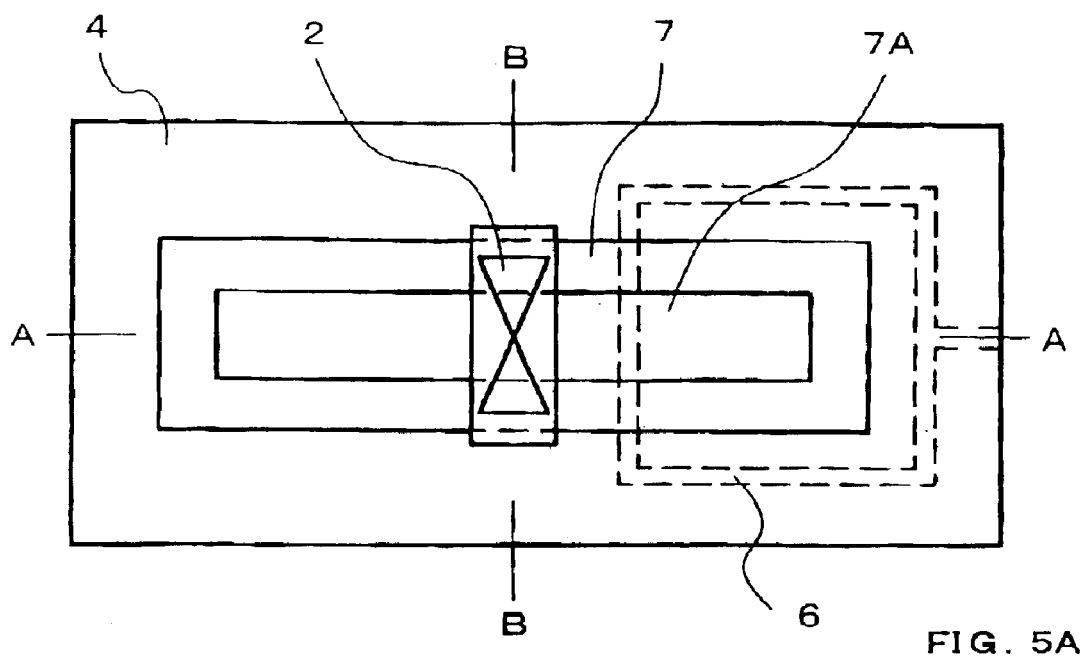
FIG. 5A is a plan view illustrating a further example of the high frequency oscillator according to the first embodiment.
Figure 5B:
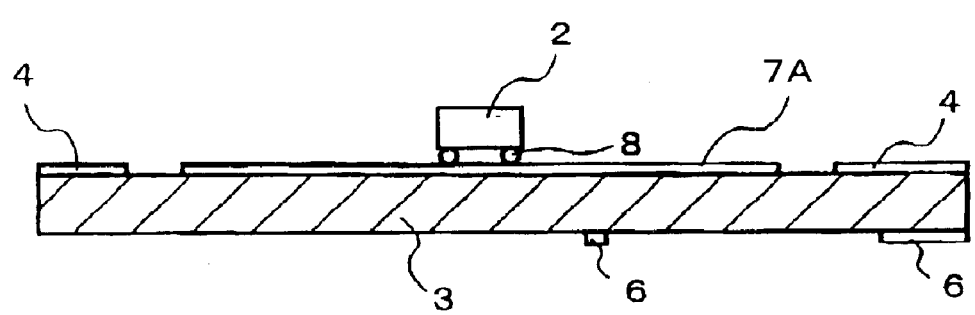
FIG. 5B is a cross-sectional view taken along a line A—A in FIG. 5A.
Figure 5C:
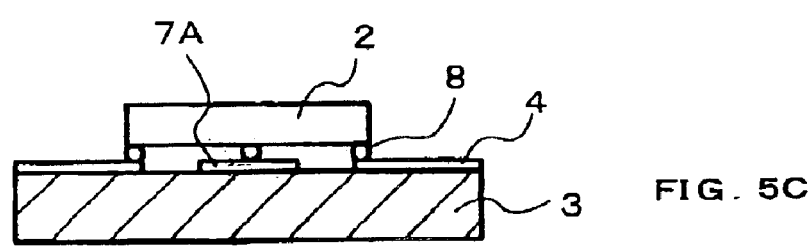
FIG. 5C is a cross-sectional view taken along a line B—B in FIG. 5A.

While each of the high frequency oscillators described above employs linear output line 6 extending in the direction in which the coplanar line extends, output line 6 is not limited to this shape. A high frequency oscillator illustrated in FIGS. 5A to 5C, which is based on the high frequency oscillator illustrated in FIGS. 3A to 3C, comprises output line 6 in a microstrip line structure having a loop-shaped leading end, such that one end of signal line 7A of the coplanar line is surrounded by the loop-shaped line portion. In this event, the loop-shaped line portion is formed closest possible to a central region of the coplanar line in which the current density is high, so that the oscillation output can be drawn out by magnetic coupling from the coplanar line.

Figure 6A:
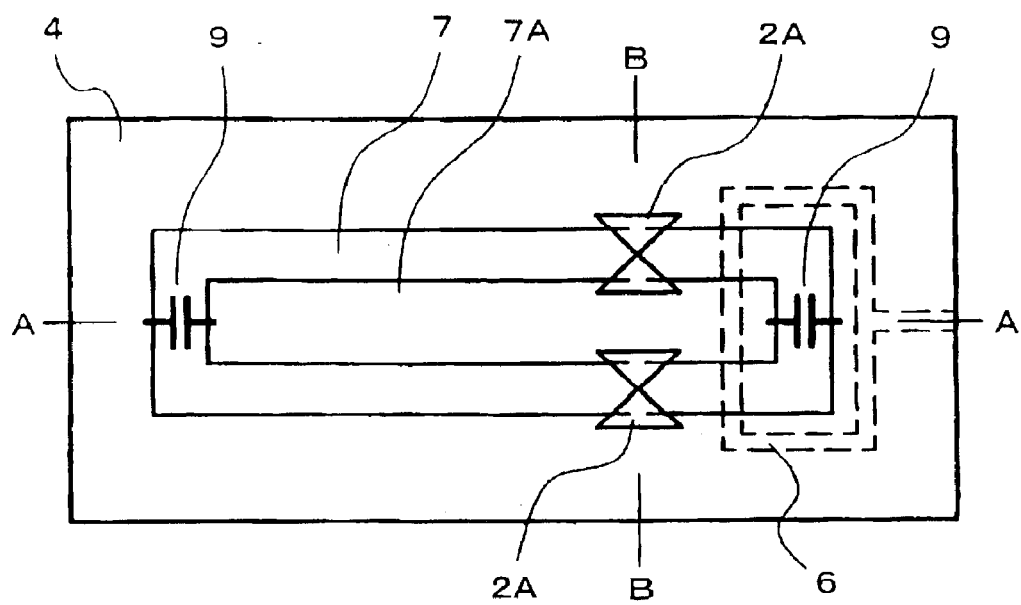
FIG. 6A is a plan view illustrating a still further example of the high frequency oscillator according to the first embodiment.
Figure 6B:
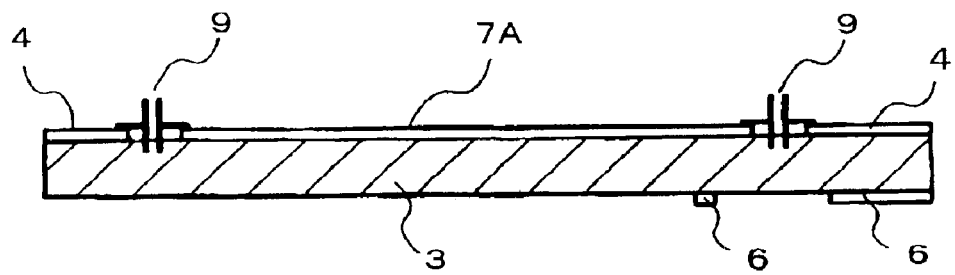
FIG. 6B is a cross-sectional view taken along a line A—A in FIG. 6A.
Figure 6C:
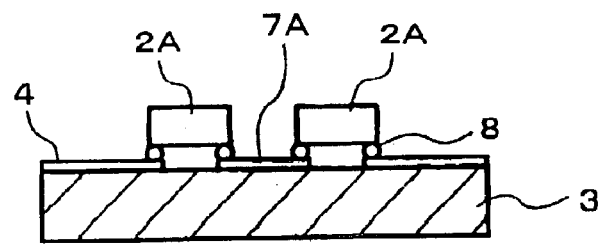
FIG. 6C is a cross-sectional view taken along a line B—B in FIG. 6A.

While each of the high frequency oscillators described above includes coplanar line resonator circuit 7 which is opened at both ends, both ends of coplanar line resonator circuit 7 may be short-circuited in high frequency terms. A high frequency oscillator illustrated in FIGS. 6A to 6C, which is based on the high frequency oscillator illustrated in FIGS. 4A to 4C, comprises capacitors 9 mounted at both ends of signal line 7A and connected to ground conductor 4, respectively, to short-circuit both ends of resonator circuit 7 in high frequency terms. In this configuration, a voltage distribution on signal line 7A presents a maximum at the center and a minimum at both ends. A current distribution presents a maximum at both ends and a minimum at the center. In addition, output line 6 is formed in a microstrip structure having a loop-shaped leading end, such that the loop-shaped line portion surrounds one end of signal line 7A of the coplanar line and capacitor 9 connected to this end, thereby drawing out the oscillation output through magnetic coupling. Unlike the high frequency oscillator illustrated in FIGS. 5A to 5C, the current distribution presents the maximum at the leading end of signal line 7A, so that the loop of output line 6 need not be extended toward the central region of signal line 7A but only has to surround the vicinity of the leading end of the signal line 7A. Accordingly, Gunn diodes 2A are not disposed in the central region of coplanar line resonator circuit 7 but close to end sides of coplanar line at which the current distribution presents larger currents.

Figure 7A:
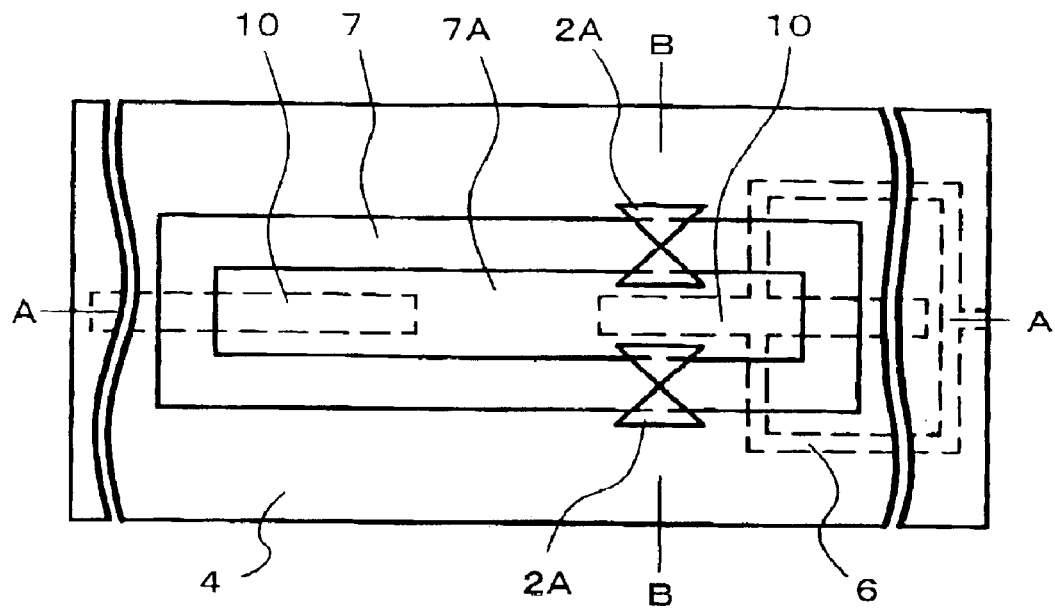
FIG. 7A is a plan view illustrating another example of the high frequency oscillator according to the first embodiment.
Figure 7B:
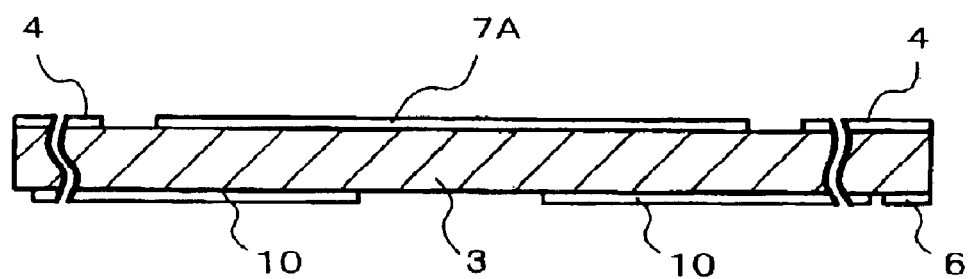
FIG. 7B is a cross-sectional view taken along a line A—A in FIG. 7A.
Figure 7C:
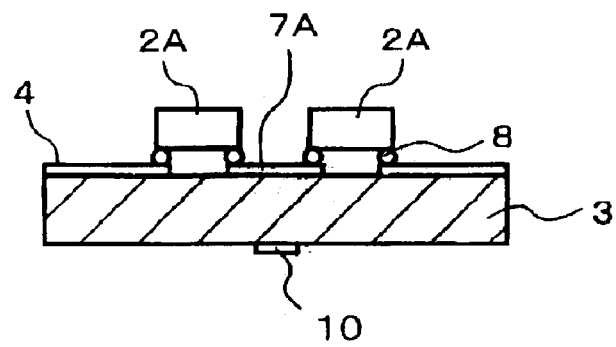
FIG. 7C is a cross-sectional view taken along a line B—B in FIG. 7A.
Figure 8A:
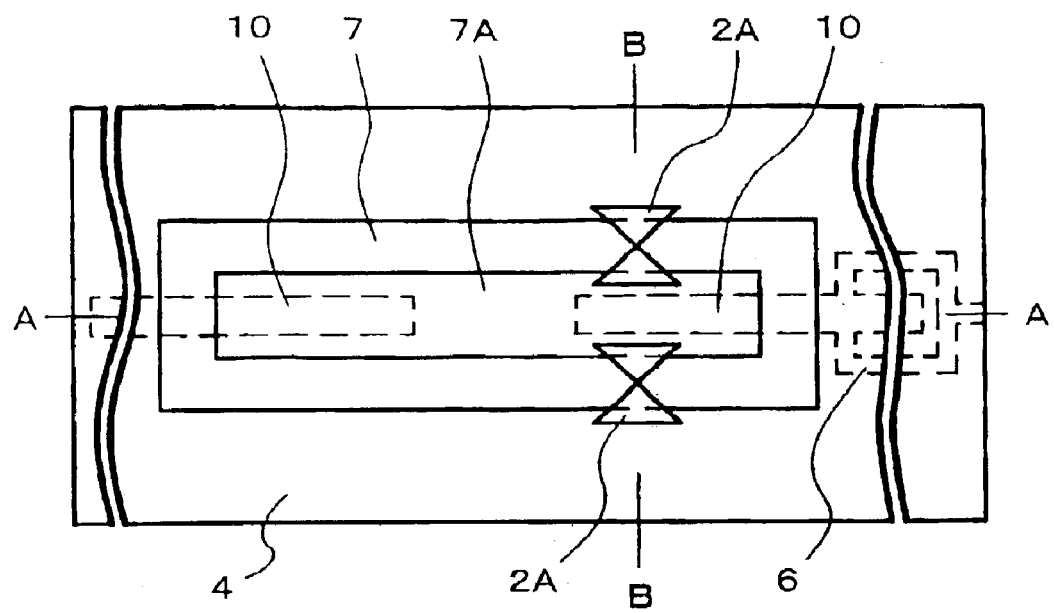
FIG. 8A is a plan view illustrating another example of the high frequency oscillator according to the first embodiment.
Figure 8B:
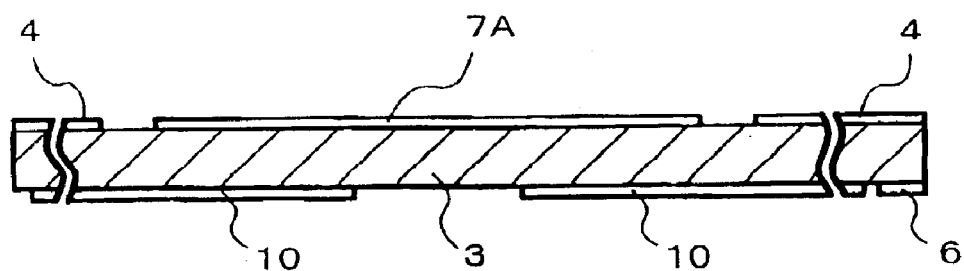
FIG. 8B is a cross-sectional view taken along a line A—A in FIG. 8A.
Figure 8C:
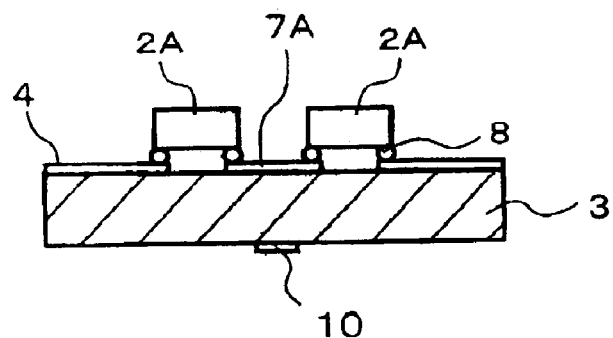
FIG. 8C is a cross-sectional view taken along a line B—B in FIG. 8A.

A means for short-circuiting the coplanar line at both ends for the oscillation frequency is not limited to the capacitor. A high frequency oscillator illustrated in FIGS. 7A to 7C comprises microstrip lines 10 on the other principal surface of substrate 3 instead of the capacitors in the high frequency oscillator illustrated in FIGS. 6A to 6C for short-circuiting the coplanar line at both ends for the oscillation frequency. Microstrip lines 10 are routed corresponding to both ends of the coplanar line, respectively, and each have an electric length of approximately $\lambda/2$, where $\lambda$ represents a wavelength corresponding to the oscillation frequency. Each microstrip line 10 has one end side overlapping on signal line 7A at the corresponding end of signal line 7A, and the other end side overlapping ground conductor 4. Microstrip line 10 on the right side in FIG. 7A intersects with and connects to the loop-shaped line portion of output line 6. In this connection, the loop-shaped line portion of output line 6 may be formed at a position away from resonator circuit 7, as illustrated in FIGS. 8A to 8C, so that it is loosely coupled to resonator circuit 7.

Figure 9A:
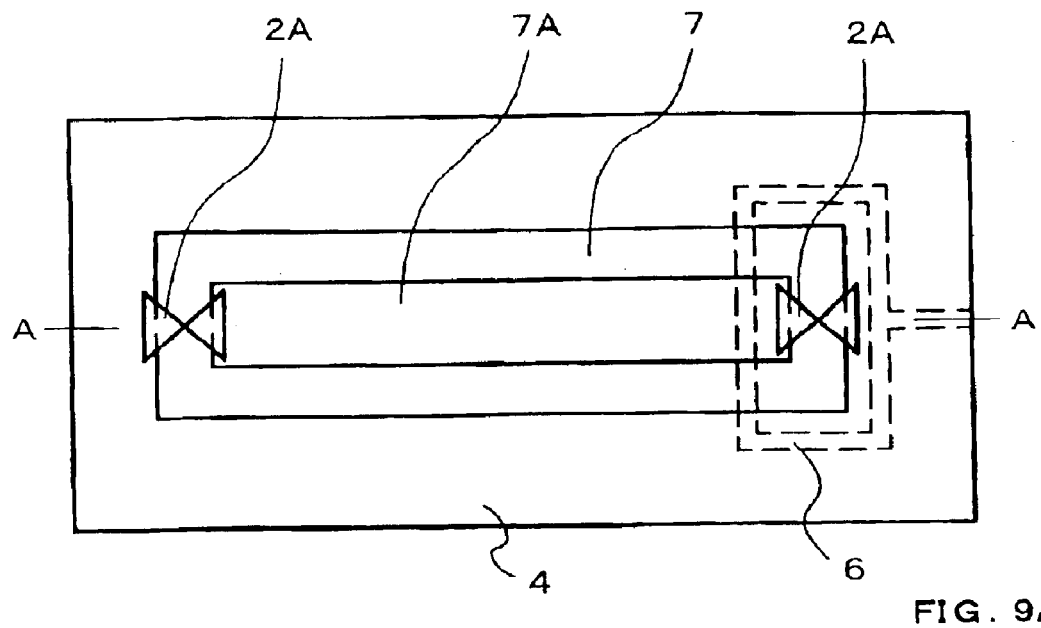
FIG. 9A is a plan view illustrating another example of the high frequency oscillator according to the first embodiment.
Figure 9B:
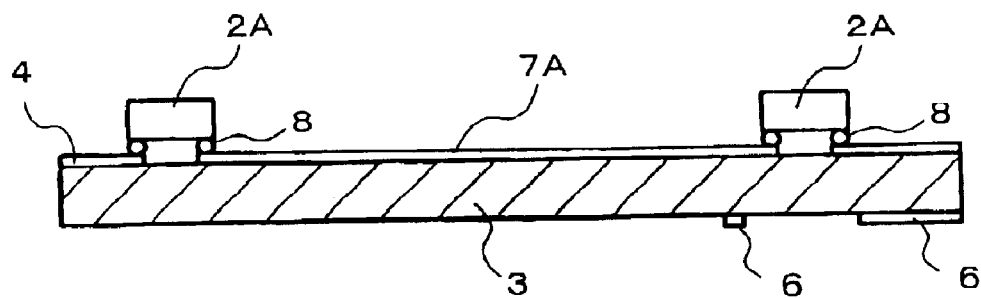
FIG. 9B is a cross-sectional view taken along a line A—A in FIG. 9A.

A high frequency oscillator illustrated in FIGS. 9A and 9B comprises Gunn diodes 2 disposed at both ends of signal line 7A to short-circuit the coplanar line at both ends in high frequency terms. Specifically, in this high frequency oscillator, the capacitors are removed from the high frequency oscillator illustrated in FIGS. 6A to 6C, and two Gunn diodes 2A are positioned at both ends of signal line 7A. Each Gunn diode 2A, which is arranged in the direction in which signal line 7A extends, is connected to the end of signal line 7A and ground conductor 4. Likewise, in this configuration, the oscillation output is delivered through output line (microstrip line) 6 having a loop-shaped leading end.

Figure 10A:
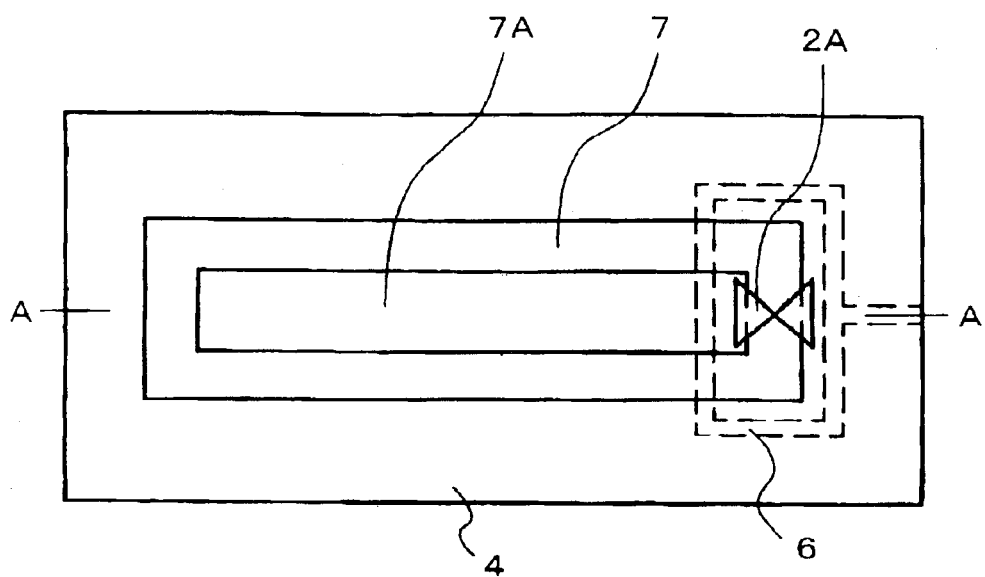
FIG. 10A is a plan view illustrating another example of the high frequency oscillator according to the first embodiment.
Figure 10B:
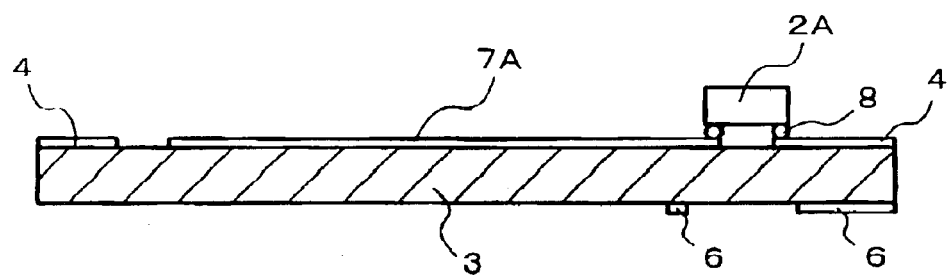
FIG. 10B is a cross-sectional view taken along a line A—A in FIG. 10A.

Further, coplanar line resonator circuit 7 may be opened at one end and short-circuited at the other end for the oscillation frequency to configure a high frequency oscillator. FIGS. 10A and 10B illustrate an example of such a high frequency oscillator which excludes the Gunn diode disposed at the end of signal line 7A around which output line 6 is not routed from the high frequency oscillator illustrated in FIGS. 9A and 9B. Here, signal line 7A is short-circuited in high frequency terms at the end at which Gunn diode 2A is mounted, and opened at the end at which no Gunn diode is mounted. In this event, the electric length of coplanar line resonator circuit 7 is set at an odd-numbered integer of $\lambda/4$, where $\lambda$ represents a wavelength corresponding to the oscillation frequency.

Further, even when Gunn diodes are mounted on both sides of coplanar line resonator circuit 7 as illustrated in FIGS. 4A to 4C, a capacitor or a microstrip line may be disposed corresponding to one end of signal line 7A to provide a resonator circuit which is short-circuited at one end and is opened at the other end for the oscillation frequency. Likewise, in this configuration, the electric length of coplanar line resonator circuit 7 is set at approximately $\lambda/4$. Loop-shaped output line 6 is routed around the high-frequency short-circuited end, at which the current distribution presents the maximum, to draw out the oscillation output therethrough.

Next, description will be made on a high frequency oscillator according to a second embodiment of the present invention. The high frequency oscillator illustrated in FIGS. 3A to 3C has Gunn diode 2, serving as a negative resistance element, disposed at one location in the central region of coplanar line resonator circuit 7, whereas the high frequency oscillator according to the second embodiment has Gunn diodes disposed at two locations in the longitudinal direction of coplanar line resonator circuit 7, such that oscillation outputs from the respective Gunn diodes are combined in power, and resulting output is delivered from output line 6. Specifically, a high frequency oscillator illustrated in FIGS. 11A to 11C excludes the Gunn diode mounted corresponding to the midpoint of signal line 7A from the high frequency oscillator illustrated in FIGS. 3A to 3C, and instead includes Gunn diodes 2 at two symmetric positions about the midpoint of signal line 7A. Gunn diodes 2 used herein each has three ports consisting of a common cathode and a pair of anodes positioned across the common cathode. Similar to the foregoing embodiment, the common cathode is connected to signal line 7A, while the anodes are connected to ground conductor 4 on both sides of signal line 7A, respectively. Linear output line 6 is routed on the other principal surface of substrate 3 corresponding to one end of coplanar line resonator circuit 7.

In this high frequency oscillator, coplanar line resonator circuit 7 is supplied with high frequency power at the resonant frequency at two locations from respective Gunn diodes 2, so that the oscillation outputs from respective Gunn diodes 2 are combined into a double output. output line 6 delivers the thus enhanced oscillation output. Due to elimination of the need for via holes for grounding Gunn diodes 2 in high frequency terms, this high frequency oscillator can also reduce a loss in power combination to provide for an efficient power combination. The positions at which Gunn diodes 2 are disposed on coplanar line resonator circuit 7 should not be so far away from the central region of signal line 7A. Since coplanar line resonator circuit 7 presents relatively small impedance at such positions, impedance matching is readily achieved between Gunn diodes 2 and resonator circuit 7. In conclusion, Gunn diodes 2 may be arranged at any positions at which the impedance matching can be achieved between Gunn diodes 2 and coplanar line resonator circuit 2.

Figure 11A:
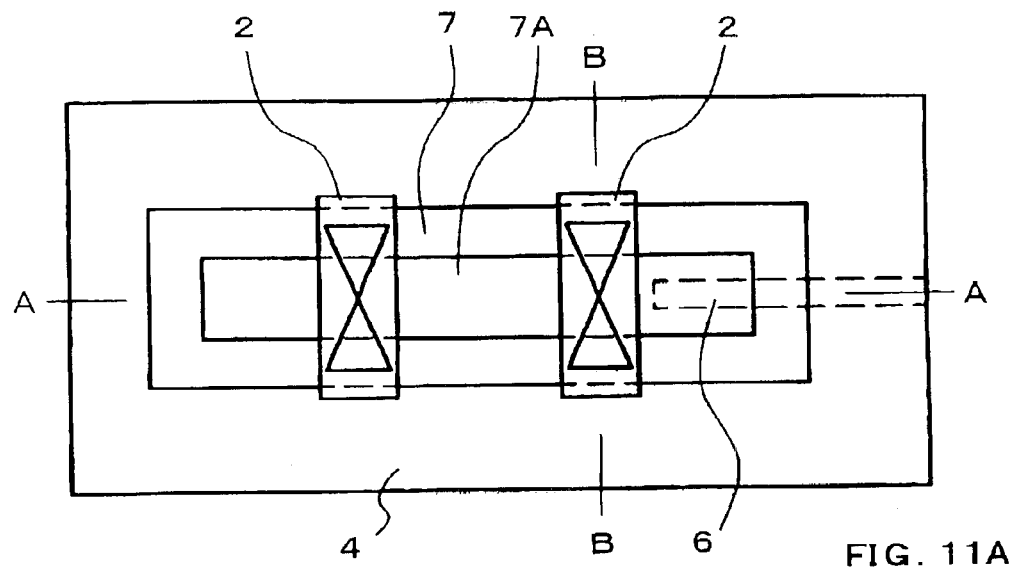
FIG. 11A is a plan view illustrating a high frequency oscillator according to a second embodiment of the present invention.
Figure 11B:
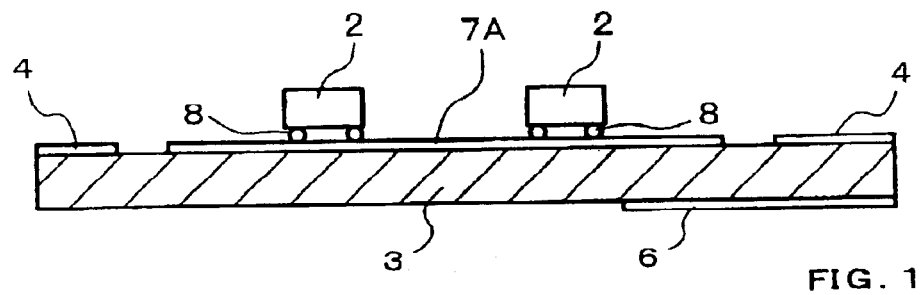
FIG. 11B is a cross-sectional view along a line A—A in FIG. 11A.
Figure 11C:
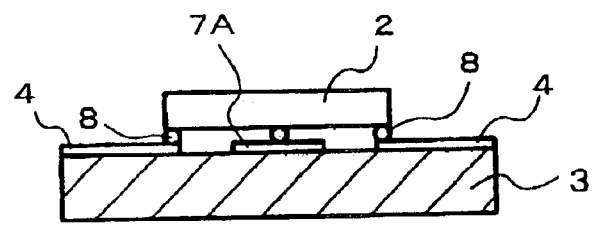
FIG. 11C is a cross-sectional view taken along a line B—B in FIG. 11A.
Figure 12A:
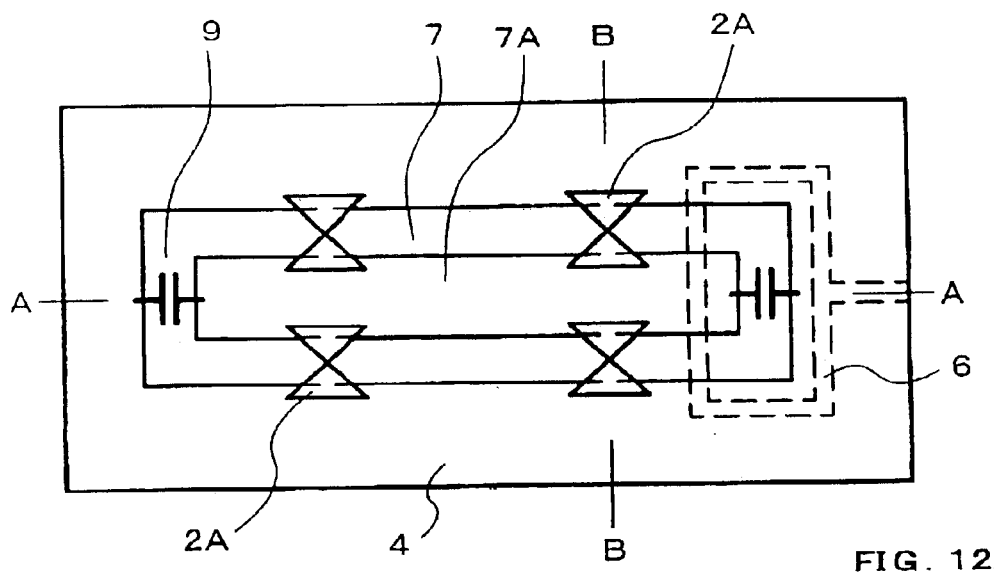
FIG. 12A is a plan view illustrating another example of the high frequency oscillator according to the second embodiment.
Figure 12B:
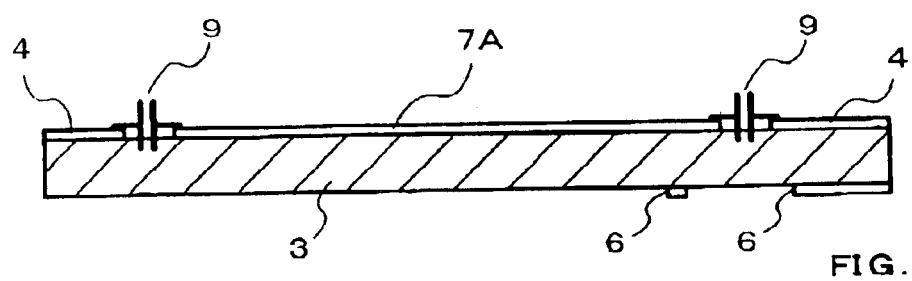
FIG. 12B is a cross-sectional view along a line A—A in FIG. 12A.
Figure 12C:
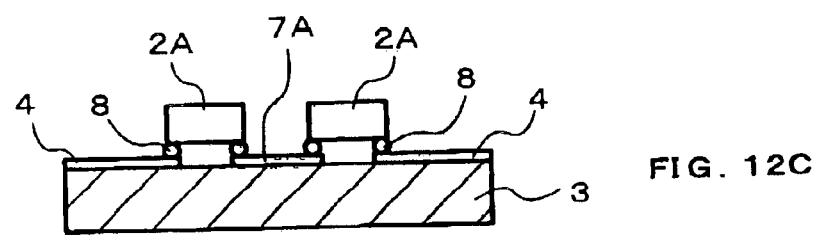
FIG. 12C is a cross-sectional view along a line B—B in FIG. 12A.

While coplanar line resonator circuit 7 are opened at both ends in high frequency terms in the high frequency oscillator illustrated in FIGS. 11A to 11C, the high frequency oscillator according to the second embodiment is not limited to the use of this coplanar line resonator circuit 7. A high frequency oscillator illustrated in FIGS. 12A to 12C, which is based on the high frequency oscillator illustrated in FIGS. 6A to 6C, employs coplanar line resonator circuit 7 which is short-circuited at both ends in high frequency terms, and additionally includes another pair of Gunn diodes 2A near the other short-circuited ends of signal line 7A at which no output line is disposed. Alternatively, in the configuration illustrated in FIGS. 12A to 12C, capacitors mounted at both ends of signal line 7A may be replaced with Gunn diodes, respectively, in which case a higher output can be provided by an increased number of Gunn diodes.

Figure 13A:
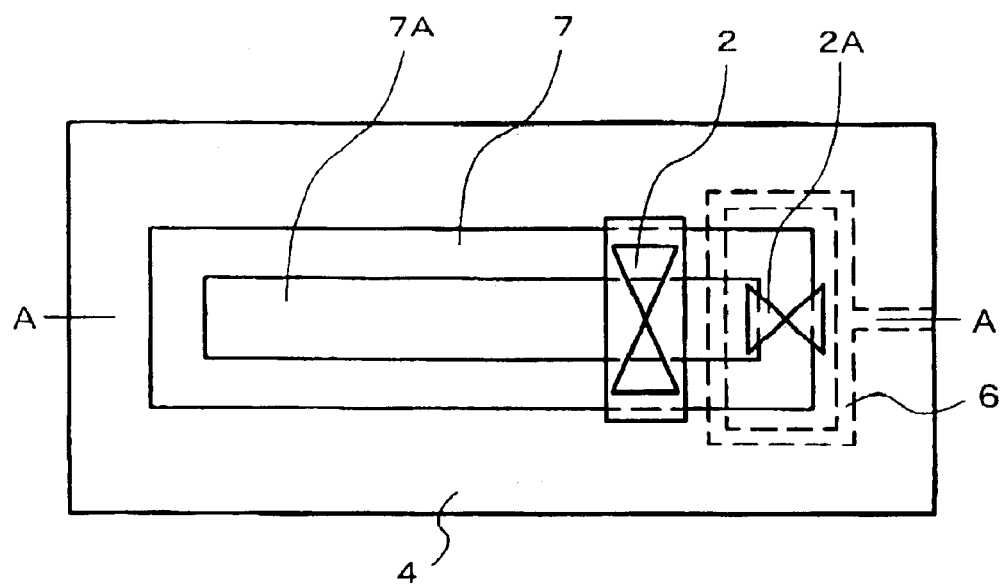
FIG. 13A is a plan view illustrating a further example of the high frequency oscillator according to the second embodiment.
Figure 13B:
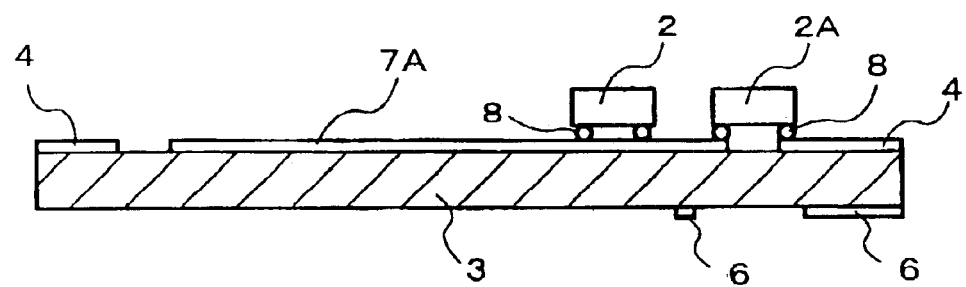
FIG. 13B is a cross-sectional view along a line A—A in FIG. 13A.

A high frequency oscillator illustrated in FIGS. 13A and 13B, which is based on the high frequency oscillator illustrated in FIGS. 10A to 10C, in turn employs coplanar line resonator circuit 7 which is short-circuited at one end and is opened at the other end in high frequency terms, and additionally includes three-port Gunn diode 2 mounted at the short-circuited end of signal line 7A. For short-circuiting resonator circuit 7 at one end of and opening at the other end for the oscillation frequency, the line length of the coplanar line is set, for example, at λ/4, so that Gunn diode 2 is mounted at the short-circuited end, at which the current distribution presents the maximum, for combining the power.

Next, description will be made on a high frequency oscillator according to a third embodiment of the present invention. Each of high frequency oscillators according to the third embodiment adds a variable reactance element to the high frequency oscillator of each embodiment described above to make the same frequency variable.

Figure 14A:
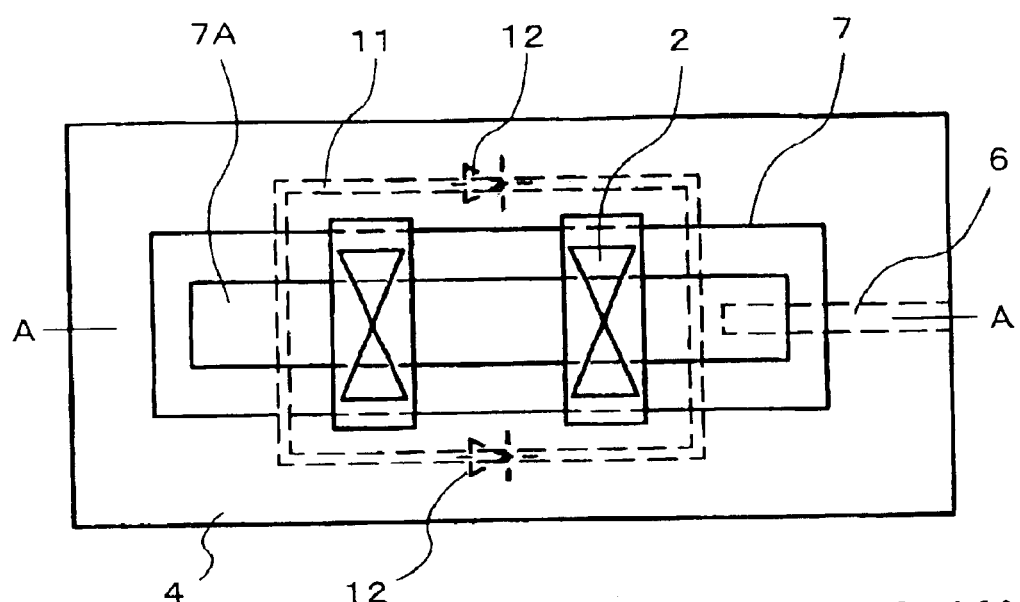
FIG. 14A is a plan view illustrating a high frequency oscillator according to a third embodiment of the present invention.
Figure 14B:
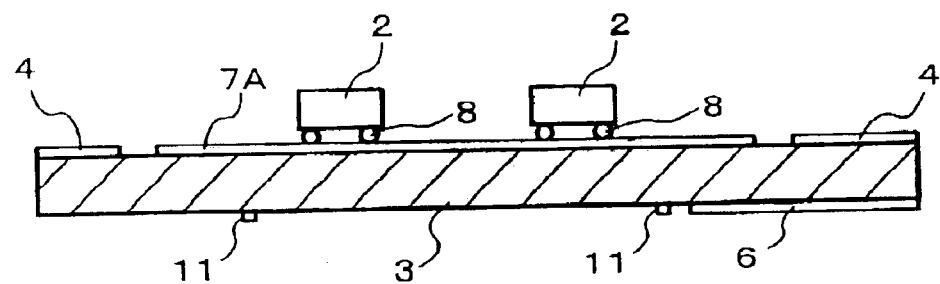
FIG. 14B is a cross-sectional view along a line A—A in FIG. 14A.

A high frequency oscillator illustrated in FIGS. 14A and 14B, which is based on the high frequency oscillator illustrated in FIGS. 11A to 11C, further includes, on the other principal surface of substrate 3, loop-shaped microstrip line 11 arranged to surround two Gunn diodes 2 and electromagnetically coupled to coplanar line resonator circuit 7, and two voltage-variable capacitance diodes 12 connected to microstrip line 11 as variable reactance elements. Voltage-variable capacitance diodes 12 are inserted into microstrip line 11 at positions on the upper and lower sides of coplanar line resonator circuit 7 as illustrated. Each voltage-variable capacitance diode 12 is applied with a control voltage through a supply line, not shown, connected to microstrip line 11.

In the configuration as described above, a change in the capacitance of voltage-variable capacitance diode caused by the control voltage affects an electromagnetic field of coplanar line resonator circuit 7, resulting in a change in the substantial electric length of the coplanar line. Since the change in the electric length results in an associated change in the oscillation frequency, a variable frequency high frequency oscillator can be implemented in a simple structure.

Figure 15A:
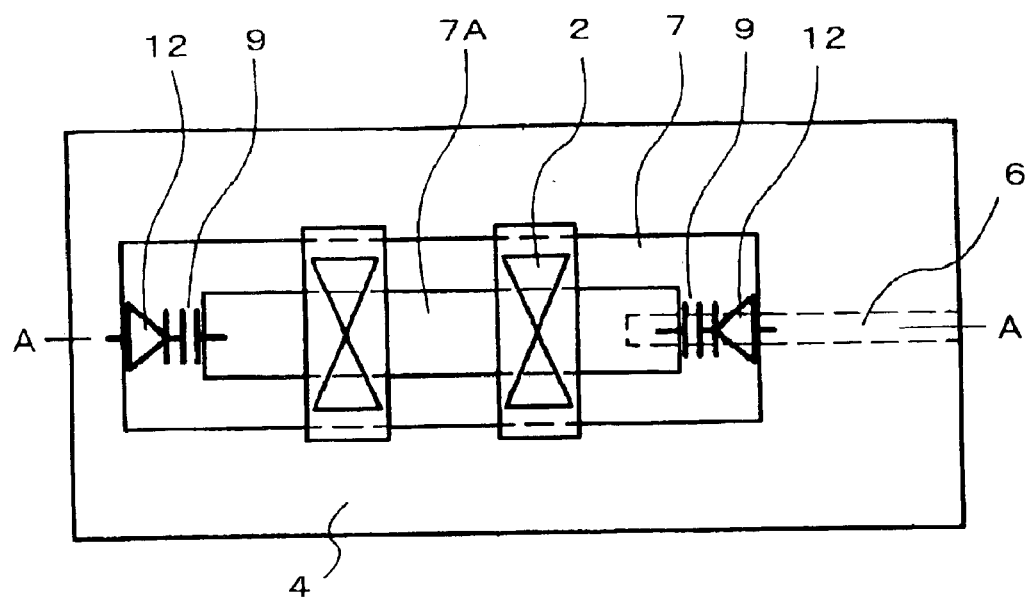
FIG. 15A is a plan view illustrating another example of the high frequency oscillator according to the third embodiment.
Figure 15B:
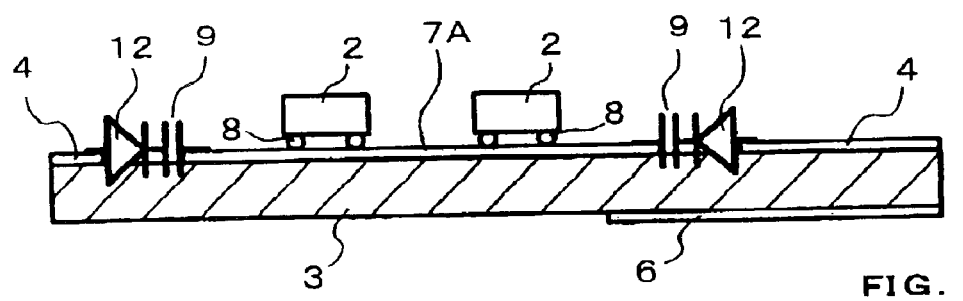
FIG. 15B is a cross-sectional view along a line A—A in FIG. 15A.

While the foregoing variable frequency high frequency oscillator employs a coplanar line resonator circuit which is opened at both ends in high frequency terms, a variable frequency high frequency oscillator can be implemented as well when using a coplanar line resonator circuit which are short-circuited at both ends in high frequency terms. A high frequency oscillator illustrated in FIGS. 15A and 15B, which is based on the high frequency oscillator illustrated in FIGS. 11A to 11C, includes series circuits each composed of capacitor 9 and voltage-variable capacitance diode 12 between each end of signal line 7A and ground conductor 4 for short-circuiting both ends in high frequency terms. A control voltage is applied to a connection of capacitor 9 with voltage-variable capacitance diode 12 through a supply line, not shown. Alternatively, voltage-variable capacitance diode 12 may be included only on one end side of coplanar line resonator circuit 7, while capacitor 9 may directly connect signal line 7A with ground conductor 4 on the other end side.

Next, a sub-harmonic injection locked high frequency oscillator according to a fourth embodiment of the present invention will be described with reference to FIGS. 16A and 16B. This injection locked high frequency oscillator is intended for improving the stability and accuracy of the oscillation frequency by injecting a signal (i.e., sub-harmonic synchronization signal) having a frequency, which is an integer submultiple of the frequency at which the oscillator should oscillate, into the high frequency oscillator from the outside.

Figure 16A:
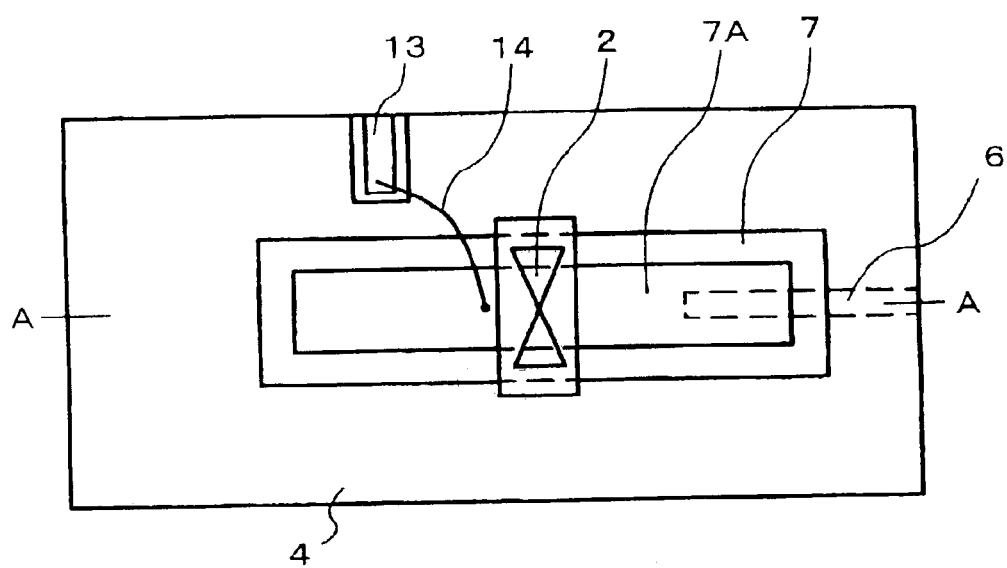
FIG. 16A is a plan view illustrating a high frequency oscillator according to a fourth embodiment of the present invention.
Figure 16B:
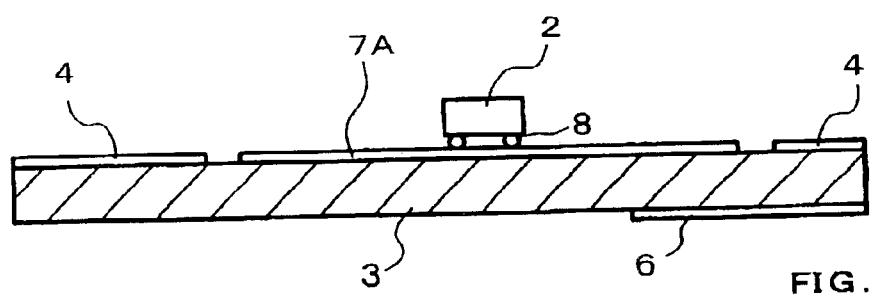
FIG. 16B is a cross-sectional view along a line A—A in FIG. 16A.

In the high frequency oscillator illustrated in FIGS. 16A and 16B, which is configured as a so-called sub-harmonic injection locked oscillator based on the high frequency oscillator illustrated in FIGS. 3A and 3B, a synchronization signal $f_0/n$ having a frequency $1/n$ (n is an integer) as high as the oscillation frequency $f_0$ is injected to synchronize the oscillation based on this synchronization signal. This high frequency oscillator comprises coplanar line 13 extending from the periphery of substrate 3 to ground conductor 4 on the one principal surface of substrate 3. A signal line of coplanar line 13 is connected to signal line 7A of coplanar line resonator circuit 7 through injection line 14. Injection signal $f_0/n$ at a relatively low frequency is injected into signal line 7A of coplanar line resonator circuit 7 from coplanar line 13 through injection line 14. Injection line 14 is connected to the midpoint of coplanar line resonator circuit 7 (i.e., signal line 7A) in the width direction, thereby maintaining the symmetry of resonator circuit 7. Due to its low frequency, the synchronization signal is not significantly affected by a parasitic component caused by injection line 14.

In this high frequency oscillator, the synchronization signal can be injected at a low impedance position on the center line in the width direction of coplanar line resonator circuit 7 at which the resonance mode is less affected, thereby stabilizing the phase noise characteristic and oscillation frequency. Further, a signal generated from a frequency synthesizer may be used as the synchronization signal, in which case a further frequency synthesizer can be implemented at a higher frequency based on this synchronization signal. As described above, since the synchronization signal is at a low frequency, it may be injected into coplanar line resonator circuit 7 from a microstrip line which is electromagnetically coupled or coupled through a via hole.

Next, a high frequency oscillator of two-phase push-push oscillation type according to a fifth embodiment of the present invention will be described with reference to FIGS. 17A and 17B. The push-push oscillator herein referred to comprises two oscillation systems configured to oscillate at the same frequency, and combines oscillation outputs from the two oscillation systems to cancel out the fundamental frequency component of oscillation and leave even-numbered order harmonic components. In the two-phase push-push oscillation, the high frequency oscillator generates a component having the frequency twice as high as the fundamental frequency of oscillation in each oscillation system, i.e., a double wave as an output.

Figure 17A:
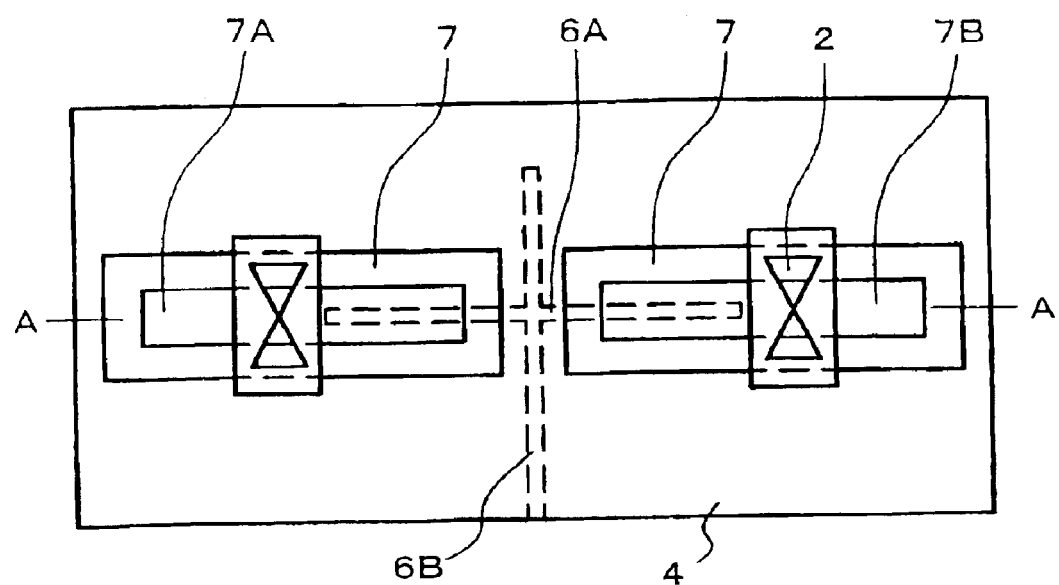
FIG. 17A is a plan view illustrating a high frequency oscillator according to a fifth embodiment of the present invention.
Figure 17B:
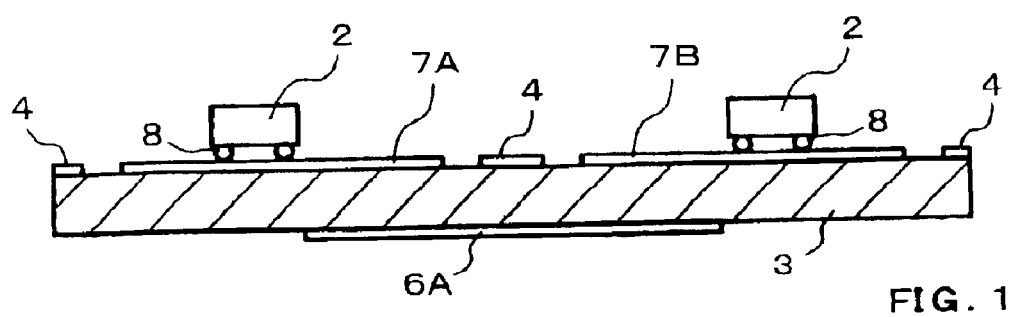
FIG. 17B is a cross-sectional view along a line A—A in FIG. 17A.

The configuration illustrated in FIGS. 17A and 17B implements the two-phase push-push oscillation using the aforementioned high frequency oscillator illustrated in FIGS. 3A to 3C. Two high frequency oscillators each illustrated in FIGS. 3A to 3B are disposed in the direction in which coplanar line resonator circuits 7 extend in such a manner that their output ends oppose each other. The signal line of resonator circuit 7 in one oscillator is denoted by 7A, while the signal line in the other oscillator is denoted by 7B. The output lines of the respective oscillators are connected in common on the other principal surface of substrate 3 to form common output line 6A in a microstrip line structure. Common output line 6A is electromagnetically coupled to signal lines 7A, 7B at both ends, respectively. On the other principal surface of substrate 3, second output line 6B in a microstrip line structure is formed to connect to the midpoint of common output line 6A. Second output line 6B extends from the periphery of substrate 3 beyond the midpoint of common output line 6A by approximately λ/4, where λ represents the wavelength corresponding to the fundamental oscillation frequency $f_0$ of the respective high frequency oscillators. The portion of second output line 6B extending beyond the midpoint functions as a short-circuited end for fundamental frequency $f_0$ of oscillation, and as an open end for double wave $2f_0$.

In the configuration as described above, since the outputs from the respective high frequency oscillators are combined in opposite phase to each other at the midpoint of common output line 6A, the fundamental frequency component $f_0$ is canceled out to leave the oscillation frequency component $2f_0$ twice as high as fundamental frequency $f_0$. Therefore, the high frequency oscillator according to the fifth embodiment can implement the two-phase push-push oscillation in an extremely simple circuit configuration and generate oscillation frequency $2f_0$ twice as high as fundamental oscillation frequency $f_0$.

Figure 18:
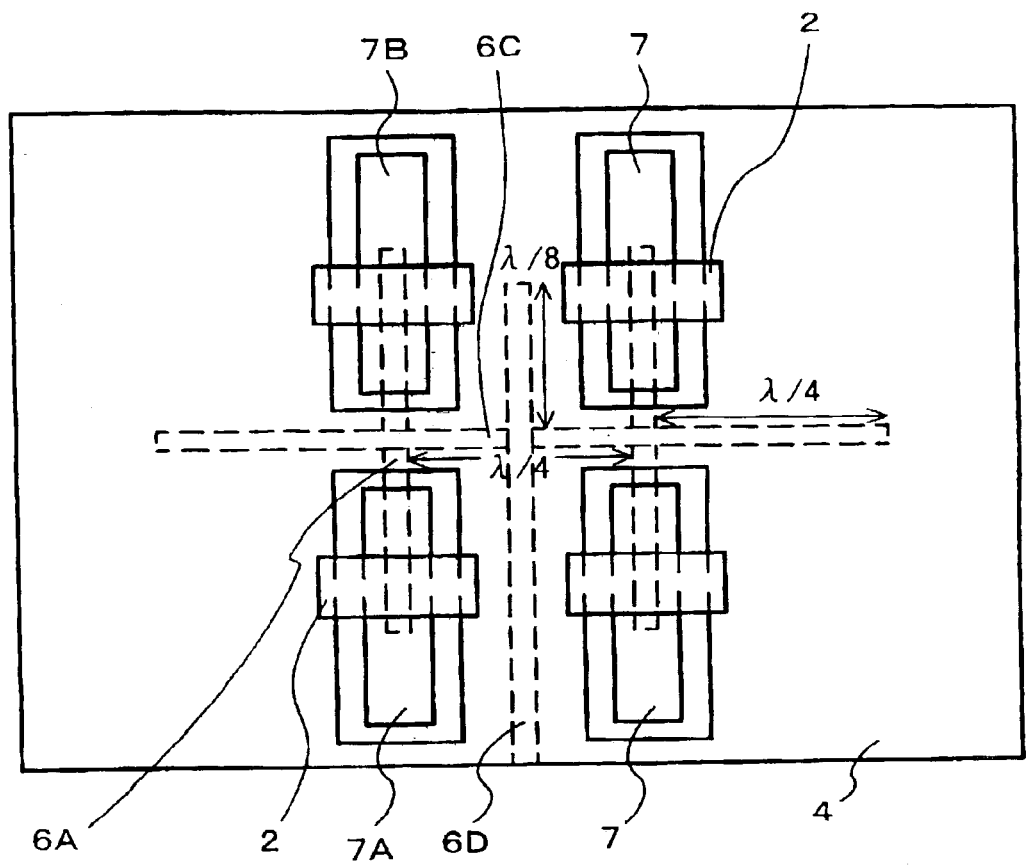
FIG. 18 is a plan view illustrating a high frequency oscillator according to a sixth embodiment of the present invention.

Next, a high frequency oscillator of four-phase push-push type according to a sixth embodiment of the present invention will be described with reference to FIG. 18. Here, a couple of the aforementioned two-phase push-push high frequency oscillators according to the fifth embodiment are connected to generate quadruple wave $4f_0$ having a frequency four times as high as fundamental oscillation frequency $f_0$ on the principle of push-push oscillation. Specifically, the four-phase push-push high frequency oscillator comprises a couple of the two-phase push-push oscillators illustrated in the fifth embodiment, which are placed side by side such that the output ends of the respective second output lines oppose each other. The second output lines are commonly connected on the other principal surface of substrate 3 and called "second common output line 6C." Second common output line 6C interconnects the midpoints of first common output lines 6A of the respective two-phase push-push oscillators. The electric length of second common output line 6C between the two connections is set at approximately $\lambda/4$. Third output line 6D in a microstrip line structure is also formed to connect to the midpoint of second common output line 6C on the other principal surface of substrate 3. Third output line 6D extends from the periphery of substrate 3 beyond the midpoint of second common output line 6C by approximately $\lambda/8$. The portion of third output line 6D extending beyond the midpoint functions as a short-circuited end for double wave $2f_0$, and as an open end for quadruple wave $4f_0$.

In the configuration as described above, since second common output line 6C operates as a half-wavelength resonator circuit for the double wave, an oscillation output of quadruple wave $4f_0$ is delivered from third output line 6D on the push-push principle. In this way, since the high frequency oscillator according to the sixth embodiment can generate a frequency component four times as high as the fundamental frequency of oscillation in an extremely simple circuit configuration, this is effective particularly for use as an oscillation source in a millimeter band and a sub-millimeter band. Of course, the four-phase push-push oscillators can be combined to generate higher-order harmonics, for example, a wave having a frequency eight times as high as the fundamental frequency of oscillation.

What is claimed is:

1. A high frequency oscillator comprising:
   a substrate;
   a resonator circuit disposed on one principle surface of said substrate, and formed of a finite-length coplanar line having a signal line and a ground conductor arranged along said signal line on both sides thereof;
   a negative resistance element for connecting between said signal line and said ground conductor; and
   an output line routed on the other principal surface of said substrate and electromagnetically coupled to said resonator circuit through said substrate.

2. The high frequency oscillator according to claim 1, wherein said output line forms a microstrip line structure together with said ground conductor.

3. The high frequency oscillator according to claim 2, wherein said negative resistance element has a first port positioned in a central region and second ports positioned in both end regions, said first port being connected to said signal line, said second ports being connected to said ground conductor of said coplanar line on both sides of said signal line, respectively.

4. The high frequency oscillator according to claim 3, wherein said negative resistance element is a Gunn diode having a common cathode and a pair of anodes sandwiching said common cathode, said common cathode connects to said first port, and said pair of anodes connect to said second ports, respectively.

5. The high frequency oscillator according to claim 3, comprising a plurality of said negative resistance elements placed on said coplanar line.

6. The high frequency oscillator according to claim 2, wherein:
   said negative resistance element has a first and a second port, and
   said high frequency oscillator includes a pair of said negative resistance elements, each said negative resistance element having the first port connected to said signal line.

7. The high frequency oscillator according to claim 6, wherein each of said negative resistance elements is a Gunn diode.

8. The high frequency oscillator according to claim 2, wherein said coplanar line is a transmission line which is opened at both ends for an oscillation frequency.

9. The high frequency oscillator according to claim 2, wherein said coplanar line is a transmission line which is short-circuited at both ends for an oscillation frequency.

10. The high frequency oscillator according to claim 9, wherein said negative resistance element is disposed on each of both ends of said signal line.

11. The high frequency oscillator according to claim 2, wherein said coplanar line is a transmission line which is short-circuited at one end and opened at the other end for an oscillation frequency.

12. The high frequency oscillator according to claim 11, wherein said negative resistance element is disposed on an end of said signal line which corresponds to said one end of said transmission line.

13. The high frequency oscillator according to claim 2, further comprising a variable reactance element loaded on said resonator circuit.

14. The high frequency oscillator according to claim 13, wherein said variable reactance element is a voltage-variable capacitive element.

15. The high frequency oscillator according to claim 2, further comprising:
   a microstrip line routed on the other principal surface of said substrate and electromagnetically coupled to said resonator circuit; and
   a variable reactance element connected to said microstrip line.

16. The high frequency oscillator according to claim 15, wherein said microstrip line is formed in loop-shaped.

17. The high frequency oscillator according to claim 15, wherein said variable reactance element is a voltage-variable capacitive element.

18. The high frequency oscillator according to claim 2, further comprising means for injecting a sub-harmonic synchronization signal into said signal line.

19. The high frequency oscillator according to claim 1, wherein said substrate is made of a dielectric material.

20. The high frequency oscillator according to claim 1, wherein said negative resistance element is disposed on said coplanar line at a position at which impedance matching is achieved.

21. A two-phase push-push high frequency oscillator comprising:
- a couple of said high frequency oscillators according to claim 2 formed on the same substrate;
- a common output line formed of commonly connected output lines of said high frequency oscillators; and
- a second output line in a microstrip line structure routed on the other principal surface of said substrate, said second output line being connected to a midpoint of said common output line, said second output line having one end extending from said midpoint by a length equal to approximately one-quarter of a wavelength corresponding to a fundamental oscillation frequency of said high frequency oscillator,
- said second output line delivering a frequency component twice as high as said fundamental oscillation frequency from the other end thereof.

22. A four-phase push-push high frequency oscillator comprising:
- a couple of said two-phase push-push high frequency oscillators according to claim 16 formed on the same substrate;
- a second common output line formed by commonly connecting said second output lines of said two-phase push-push high frequency oscillators; and
- a third output line in a microstrip structure routed on the other principal surface of said substrate, said third output line being connected to a midpoint of said second common output line, said third output line having one end extending beyond said midpoint by a length equal to approximately one-eighth of the wavelength corresponding to the fundamental oscillation frequency,
- said third output line delivering a frequency component four times as high as said fundamental oscillation frequency from the other end thereof.

* * * * *